United States Patent [19]

Fisher

[11] 4,158,891
[45] Jun. 19, 1979

[54] TRANSPARENT TRI STATE LATCH

[75] Inventor: Edwin P. Fisher, North Abington, Mass.

[73] Assignee: Honeywell Information Systems Inc., Waltham, Mass.

[21] Appl. No.: 821,877

[22] Filed: Aug. 4, 1977

Related U.S. Application Data

[63] Continuation of Ser. No. 605,358, Aug. 18, 1975, abandoned.

[51] Int. Cl.² .................... G11C 11/40; H03K 19/08
[52] U.S. Cl. .................................. 365/222; 307/209; 307/238; 365/205
[58] Field of Search ............... 365/45, 205, 220, 222; 307/209, 238

[56] References Cited

U.S. PATENT DOCUMENTS

| | | | |
|---|---|---|---|
| 3,697,775 | 10/1972 | Kane | 307/209 |
| 3,771,148 | 11/1973 | Aneshansley | 307/238 X |
| 3,806,898 | 4/1974 | Askin | 365/222 |
| 3,912,947 | 10/1975 | Buchanan | 307/209 X |
| 3,949,381 | 4/1976 | Dennard et al. | 365/205 |
| 3,980,898 | 9/1976 | Priel | 307/209 |

OTHER PUBLICATIONS

Application note AP-10; Intel Corporation; "Memory System Design with the Intel 2107B 4K Ram"; 1975.

*Primary Examiner*—David L. Trafton
*Attorney, Agent, or Firm*—Nicholas Prasinos; Ronald T. Reiling

[57] ABSTRACT

Tri state logic gates in series are disclosed for permitting the latching of information from a first circuit by enabling a second circuit at the time information from the first circuit becomes valid. At the start of the memory cycle the second circuit is disabled and the first circuit is enabled. The data in the memory will appear at the output of the memory circuit to be delivered to the computer. Data is latched and retained on the data output bus by enabling the second circuit which assumes the level that appears on its input when enabled. The first circuit may then be disabled to permit it to carry out other operations.

6 Claims, 7 Drawing Figures

TRANSPARENT TRI STATE LATCH

This is a continuation of application Ser. No. 605,358, filed Aug. 18, 1975, now abandoned.

RELATED REFERENCES

Incorporated into this application by reference is application note AP-10 entitled "Memory System Design with the Intel 2107B 4K RAM" published in 1975 by Intel Corporation of 3065 Bowers Avenue, Santa Clara, Calif. 95051.

BACKGROUND OF THE INVENTION

1. Field of the Invention

The field of the invention pertains to random access computer memories RAM of the magnetic or MOS type and more particularly to an apparatus and method for latching the output of a RAM substantially instantaneously with the appearance of data at the output of the RAM.

2. Description of the Prior Art

Random access memories either of the magnetic core type or of the MOS type generally require additional operations to be performed on the memory after readout or write. For example, in the magnetic core memory read-out is effected by destroying the data content of the memory. To preserve the data content of the memory, a further write operation is required after read-out. However, it is not desirable or efficient to add the time required for read-writing information back into the memory to the total access time of the memory. Accordingly, the read-out data is preserved in some form of latch which may typically be a flip-flop. However, flip-flops add to total access time to store and retain the output information. Accordingly, the total access time of a memory requiring this type of latch is increased by its use. Similarly MOS memories require periodic refreshing and it is not desirable or efficient to refresh such memories during the time that information is being accessed from the memory. Accordingly, any type of latch which tends to increase the access time steals time from other operations such as refreshing, which could be performed at a time other than during access time.

What is needed therefore is a latching circuit or circuits in combination with the RAM wherein the data output does not have to pass through the latching circuit itself, but is latched substantially instantaneously to its one or zero state as soon as it appears on the output of the RAM.

In the above subject Intel reference incorporated herein by reference, there is described an MOS memory chip with a tri state enable of the type utilized in the invention. This enable permits the output to appear substantially instantaneously to the input of the MOS memory. However, since the output follows the input, when the input enable signal is removed, so is the output. What is further needed is that this output remain latched to its input state even though the input enable signal is removed. To fully appreciate the problem, a brief description of this prior art latch will first be given utilizing FIGS. 1-3.

Referring to FIG. 1 there is shown a block diagram of a typical prior art MOS memory chip having a storage capacity for 4,096 bits; also shown as part of the semiconductor memory chip is the appurtenant circuit utilized for addressing, reading and writing into the semiconductor memory. The memory array 102 has 4,096 1 bit positions arranged in an array of 64 columns and 64 rows. Each storage cell in the memory array is implemented with a single transistor and a storage capacitor and are called single transistor cells. Any memory cell may be accessed by the coincidence of addresses $A_0$–$A_5$ defined by row decode in buffer register 101 and column select addresses $A_6$–$A_{11}$ defined by column decode and buffer register 106. The timing control generator 103 provides the internal timing signals for decoding, read/write strobing, data gating and output gating. The timing circuits are activated by the positive-going edge of a chip enable signal CE. The leading edge of the chip enable CE signal also latches address buffer registers 101 and 106. Since the addresses are latched shortly after chip enable goes high, the address may be changed long before the memory cycle is completed thus shortening the set up for the next cycle. With the address thus properly selected, the chip select CS signal controls the data I/O gating circuits 105 internal to the entire semiconductor chip of FIG. 1. When the chip select signal CS is high, the output data buffer in the I/O unit 105 is in a high impedance state and the data in buffer in the I/O unit 105 is electrically isolated from the data-in input pin $D_{in}$. Since the chip select signal CS controls the internal data buffers and not the timing generators or address buffers, refreshing of the chip may be done with the chip select signal CS high by initiating a read/refresh or write cycle. The write enable signal WE permits the data-in in the data-in buffer (not shown) to be written in the memory cell selected by the coincidence of addresses $A_0$–$A_5$ and $A_6$–$A_{11}$.

Three power supplies are required relative to ground for the chip of FIG. 1. $V_{DD}$ supplies +12 volts to chip enable signal CE. $V_{BB}$ is a minus volt power supply and $V_{CC}$ is +5 volts.

FIG. 2 shows the detailed circuitry for the implementation of a single storage cell implemented with a single transistor 201 and a storage capacitor $C_{STG}$ 202. A charge on storage capacitor 202 is gated to the bit sense line 203 by the MOS transistor 204 connected to the column sense line 205. (Note that for a given column select, 64 storage devices are gated to the respective 64 bit sense lines).

To illustrate the operation of the circuit, first consider a read operation wherein the storage capacitor $C_{STG}$ 202 is discharged and node 1 is at ground. With the bit sense lines 203 precharged to V' by transistor 201 and allowing time for the stabilization of the address decoders, the selected column select line is caused to go high, causing transistor 204 to turn on, thus electrically connecting the storage capacitor $C_{STG}$ 202 to the bit sense line. At this time, the charge on capacitor 206 which is proportional to the precharge voltage V' is redistributed between capacitor 206 and capacitor 202. However, since the charge in capacitor 206 is much larger than the charge on capacitor 202 the voltage on the bit sense line will be very small. The sense amplifier 207 is such that it detects very small changes in bit sense line voltage and latches in a state near $V_{SS}$ (ground) of $V_{DD}$ (plus 12 volts), depending on the state of the storage cell. Note that during this read operation of the storage cell 202, the original data (i.e. charge) on the storage cell is destroyed. Data is rewritten back into the storage capacitor 202 by the sense amplifier 207 after it has latched in the proper state. For example, if the storage capacitor 202 was initially charged to approximately 10 volts, the sense amplifier 207 will latch the bit sense line to approximately 10 volts and, since the column select line 205 is high, the original data is automatically rewritten into storage capacitor 202.

FIG. 3 is a plot of the voltage on the bit sense line and shows the 3 states in which the memory may latch — i.e. the logic 0 state, the logic 1 state and the neuter or "I don't care" state.

A complete description of the details of the above prior art circuit is described in the above referenced Intel reference. Also the chip itself is commercially available from the Intel Corporation and is identified as the Intel Memory 2107B. Note that only one tri state circuit is provided for each memory cell. Additionally, prior art RAM's of the magnetic core type are well known, see U.S. Pat. No. 3,181,131 issued Apr. 27, 1965 and incorporated herein by reference.

OBJECTS OF THE INVENTION

It is a primary object of the invention to provide a memory cell whose output is latched substantially instantaneously to the input and remains latched when the input signal is removed.

Another object of the invention is to provide a novel memory circuit having 2 active tri state amplifier circuits per memory cell.

Still another object of the invention is to provide an improved random access memory for computer systems.

These and other objects of the invention will become apparent to the person of ordinary skill in the art.

SUMMARY OF THE INVENTION

In combination with a random access memory cell 2 tri state circuits A and B are provided. The tri state circuits have 3 output characteristics—high, low and high impedance. At the start of the memory cycle, circuit B is disabled and circuit A is enabled. Thus the data in the memory will appear at the output of the RAM memory circuit to be delivered to the computer. This data is latched and retained on the data output bus by enabling circuit B. Circuit B will latch because its output will assume the level that appears on its input when enabled. The RAM memory is then disabled to permit it to recover in preparation for the next cycle.

BRIEF DESCRIPTION OF THE DRAWINGS

For a better understanding of the invention, reference may be had to the preferred embodiment, exemplary of the invention, shown in the accompanying drawings, in which.

DESCRIPTION OF THE PREFERRED EMBODIMENT

Figure 1:
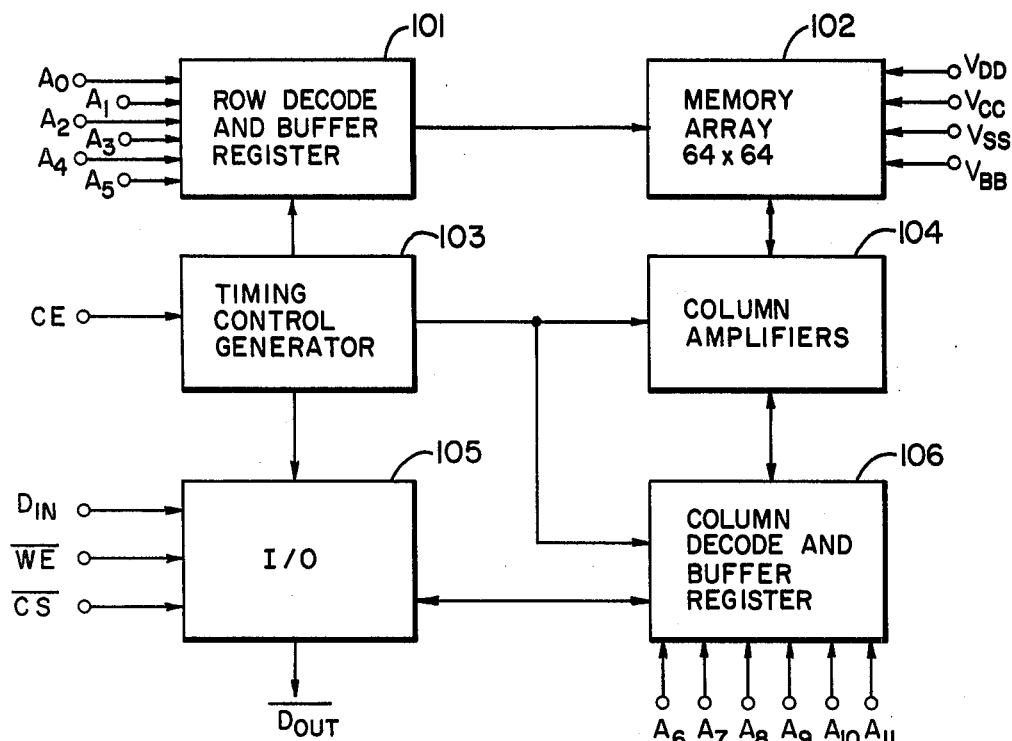
FIG. 1 is a prior art diagram of a typical memory circuit that may be utilized in the invention.
Figure 2:
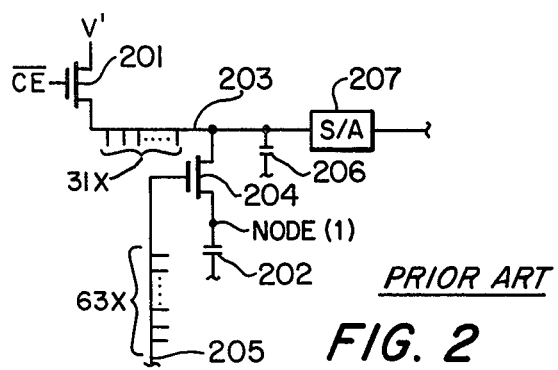
FIG. 2 is a more detailed circuit diagram of a portion a FIG. 1.
Figure 3:
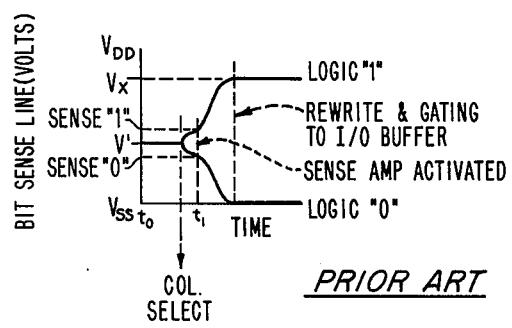
FIG. 3 is a plot of the voltage of the device of FIG. 1 illustrating the 3 states it can assume.
Figure 4:
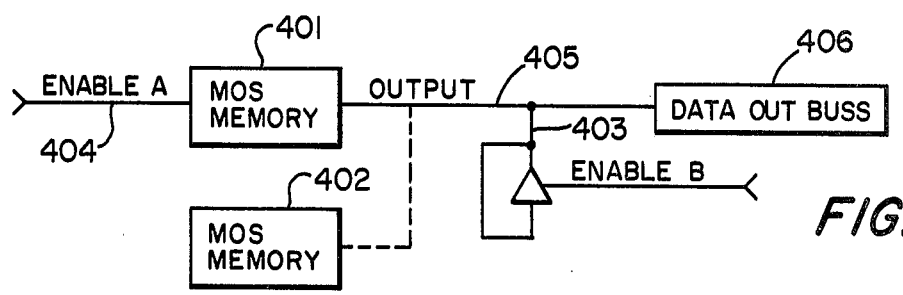
FIG. 4 is an overall schematic diagram of the invention.
Figure 5:
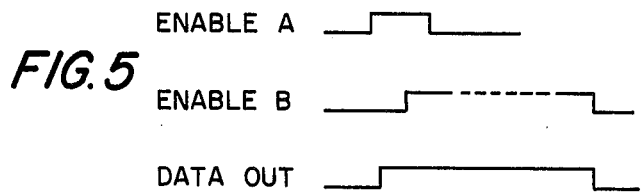
FIG. 5 is a timing diagram of the invention.

Referring now to FIG. 4 there is shown a typical random access RAM memory of the MOS type previously described and shown on FIGS. 1-3. An enable A signal is applied to input terminal 404 and corresponds to the chip enable signal CE and further shown as enable A on FIG. 5. Thus during this portion of the memory cycle, the tri state output circuit of MOS memory 401 (previously described) is enabled while the tri state amplifier circuit 403 is disabled. The data in a selected memory cell of MOS circuit 401 will appear at the output 405 of the MOS memory circuit 401. In order to obtain the data output on the data output bus 406 tri state amplifier circuit 403 is enabled by enable signal B. This is further illustrated by the timing diagram on FIG. 5. (The tri state amplifier circuit 403 is also commercially available from Texas Instrument Corporation and is a low power Schottky type circuit having catalog number 74LS367). When tri state amplifier 403 is enabled, it will latch the information on the output 405 so that it is retained on the data out bus 406 because its output will assume the voltage level that appears on its input. The MOS memory 401 is now disabled to permit other operations to take place; however, as shown on FIG. 4, the data out on the data out bus 406 remains in the same state that it was when tri state amplifier 403 was enabled. (See also timing diagram, FIG. 5).

Figure 6:
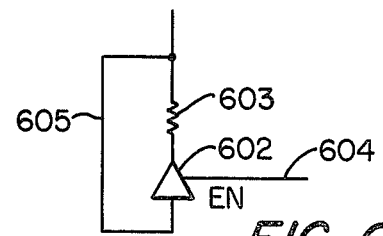
FIG. 6 is a detailed circuit diagram of the latching amplifier circuit of the invention.

Referring now to FIG. 6 there is shown a typical latching circuit 601. An amplifier 602 has a resistor 603 in series and the output of the amplifier 602 is coupled to its input via circuit 605. An enabling signal is applied to input terminal 604. Note that a small resistor R603 typically of 100 ohms has been included in the latching circuit 601 at the output of the amplifier to prevent possible damage to the memory circuit in the event of a timing failure while the memory circuit is enabled. However, it should be noted that the resistor R603 is not absolutely necessary.

Figure 7:
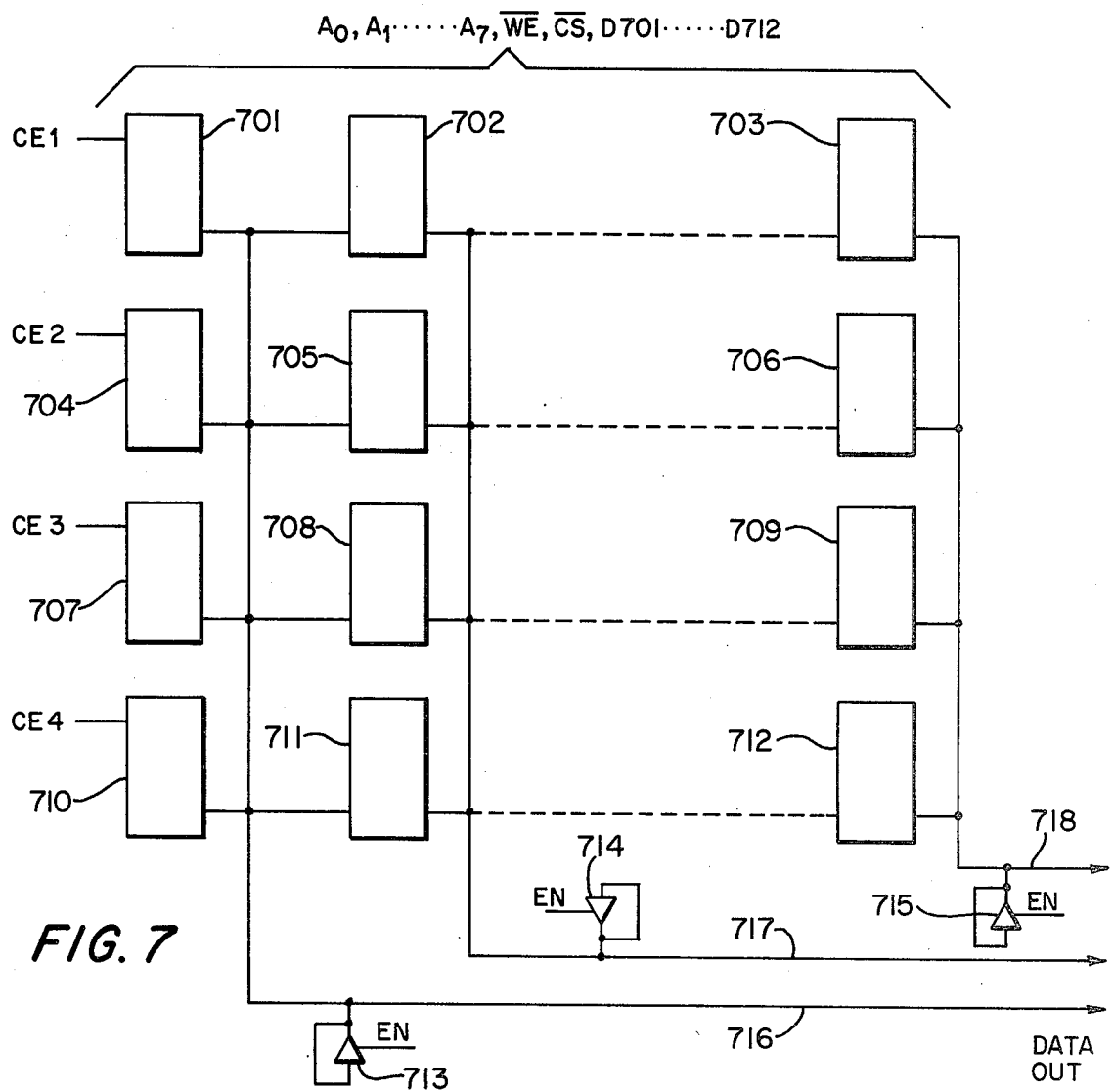
FIG. 7 is a 16K by 8 bit word memory fabricated utilizing the invention.

Referring now to FIG. 7 there is shown a 16 kilobit by 8 bit memory utilizing the invention. Each memory chip 701-712 is of the Intel 2107B type. For an 8 bit word 8 columns of 4 rows each is utilized. Similarly, a word may comprise any number of bits by simply adding columns and the total capacity of the memory may be increased by simply adding rows. Each of the first column of semiconductor memory chips 701, 704, 707 and 710 has a tri-state circuit (i.e., low, high and high impedance state) which is serially connected to a latching tri-state circuit 713 on data output line 716. Similarly, the outputs of memory chips 702, 705, 708 and 711 are connected in series with tri-state latching circuit 714 on data output line 717; and the output of memory chips 703, 706, 709 and 712 are connected in series with tri-state latching circuit 715 on data output line 718. For clarity, rather than repeat each signal shown on FIG. 1, the most important signals have been consolidated and shown at the top of the diagram $A_0, A_1 \ldots A_7$, etc. It should be understood that any of these signals may be applied to any chip 701-712.

To select and latch a typical 8 bit word, for example, in the semiconductor chips 704, 705 . . . and 706 of the second row, the row decode buffer in each chip would address selected cells within the memory chips 704, 705 . . . 706. The addresses on the column decode would then cross each appropriate cell (one cell per chip) within devices 704, 705 . . . 706. Hence an 8 bit word within the row 2 memory chips is selected. In order to latch the information within each cell of the 8 columns, the tri state latch circuits 713, 714 and 715 are enabled. The memory input chip enable signals CE2 can then be disabled while the data is retained in data out lines 716, 717 ... 718. Note that the latching is substantially instantaneous and does not add to the access time of the memory array.

What is claimed is:

1. In a rectangular array of random access memory chips having tri-state outputs, the combination which comprises plural tri-state amplifiers each having both its input and output connected to a column of said tri-state outputs.

2. In a random access memory chip having a tri-state output responsive to a first enable signal, the combination which comprises a tri-state latch connected in electrical series with said tri-state output and responsive to a second enable signal for capturing the output data signals of said random access memory without substantially increasing memory access time wherein said tri-state latch is a tri-state amplifier having both its input and output connected to said tri-state output.

3. A latching network, which comprises:
   (a) a first tri-state logic means responsive to a first enabling signal and in electrical communication with a digital transmission line for applying a high impedance to said line to isolate a data source when not enabled, and for capturing discrete data on said line when enabled; and
   (b) a second tri-state logic means responsive to a second enabling signal and including a tri-state amplifier having its input and output terminals connected to the output of said first means for latching said line to the output level of said first means when enabled, and presenting a high impedance to said line when not enabled.

4. A RAM memory system, which comprises:
   (a) RAM memory means having tri-state outputs and responsive to a first enable signal for applying stored electrical signals to an output data line; and
   (b) latching means in electrical communication with said output data line and responsive to a second enable signal applied prior to the removal of said first enable signal for latching signals on said output data line despite the removal of said first enable signal from said RAM memory means, said latching means further providing a high impedance to said output data line when said second enable signal is not applied, whereby the access time of said RAM is not substantially increased wherein said latching means is comprised of an amplifier having amplifier input and output terminals and a resistor having resistor input and output terminals in series and further having the output resistor terminal coupled to the amplifier input terminal.

5. The network as recited in claim 4 wherein said RAM memory means is a metal oxide semiconductor (MOS) type memory.

6. The latching means as recited in claim 4 wherein said RAM memory means is a metal oxide semiconductor (MOS) type memory.

* * * * *